US006285187B1

(12) United States Patent
Mock

(10) Patent No.: US 6,285,187 B1
(45) Date of Patent: Sep. 4, 2001

(54) METHOD AND APPARATUS FOR REDUCING ARTIFACTS IN ECHO PLANAR IMAGING

(75) Inventor: Bryan J. Mock, Lake Mills, WI (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/301,413

(22) Filed: Apr. 28, 1999

(51) Int. Cl.[7] ................................................ G01V 3/00
(52) U.S. Cl. ..................... 324/309; 324/306; 324/307; 324/312
(58) Field of Search ................................. 324/309, 307, 324/306, 312

(56) References Cited

U.S. PATENT DOCUMENTS 5,151,656 * 9/1992 Maier et al. .......................... 324/309
5,647,362 7/1997 Fuderer et al. ................... 128/653.2

OTHER PUBLICATIONS

Xiaoping Hu, Tuong Huu Le; "Artifact Reduction in EPI with Phase–Encoded Reference Scan", pp. 166–171.

* cited by examiner

*Primary Examiner*—Christine Oda
*Assistant Examiner*—Brij B. Shrivastav
(74) *Attorney, Agent, or Firm*—Fletcher, Yoder & Van Someren

(57) ABSTRACT

A technique is described for correction of phase errors in bipolar readout gradient examination sequences, such as EPI pulse sequences. The technique employs short reference pulse sequences associated with each readout pulse train. Reference data is collected for positive and negative lobes of the reference sequence. Each reference sequence is employed to estimate a phase error of an associated readout sequence. Data collected in the readout sequence is then corrected based upon the estimated errors. Phase errors resulting from changes in scan orientation are thereby corrected for each frame of k-space data without significantly increasing the data acquisition time.

16 Claims, 4 Drawing Sheets

METHOD AND APPARATUS FOR REDUCING ARTIFACTS IN ECHO PLANAR IMAGING

FIELD OF THE INVENTION

The present invention relates generally to the field of magnetic resonance imaging systems, such as those used in medical diagnostics applications. More particularly, this invention relates to a technique for reducing the occurrence of artifacts in reconstructed images obtained through echo planar imaging techniques.

BACKGROUND OF THE INVENTION

Magnetic resonance imaging (MRI) systems have become increasingly popular tools for medical diagnostics. Such systems are based on the influence of controlled magnetic fields on gyromagnetic material within a subject of interest. The gyromagnetic material, typically molecules such as water, have characteristic behaviors in response to external magnetic fields. The precession of spins of such molecules can be influenced by manipulation of such fields to obtain magnetic resonance emissions which can then be detected and processed to reconstruct useful images of the subject.

In MRI systems used in medical applications, a highly uniform primary magnetic field is produced by an electromagnet such that the field is generally aligned along the anatomy to be imaged. A series of gradient coils positioned around the subject produce additional magnetic fields used to select a desired slice of the anatomy to be imaged, and to encode positions of individual volume elements or voxels in the slice. Finally, a radio frequency coil is employed to pulse the gyromagnetic material to cause emissions from the material as it attempts to realign itself with the primary magnetic field. The emissions are sensed by a detection coil, which may be the same coil as the radio frequency coil. The sensed signals are then processed to identify the emissions emanating from specific locations of the voxels. A reconstructed image may be formed based upon the resulting data, wherein individual picture elements or pixels represent the voxels of the selected slice.

A wide variety of pulse sequences have been developed for MRI systems, and specifically adapted to various imaging needs. One motivating impetus behind a number of new imaging pulse sequences has been the reduction in the time required to acquire the image data. Such reductions in time are particularly useful for imaging moving tissues (both due to natural movement and movement of a subject patient), as well as for reducing the discomfort of patients in the examination process. For example, dramatic reductions in acquisition time have been obtained through a technique referred to as echo planar imaging (EPI). In this technique, successive data echoes corresponding to emissions from gyromagnetic material in a given data acquisition line are used to encode position information. The technique obtains rapid acquisition of data by providing image encoding from a train of successive data echoes within one relaxation interval rather than through phase encoding of separate lines of data with each relaxation interval as in other techniques.

Imaging sequences used in MRI systems, such as sequences used in EPI acquisition, employ bipolar readout gradients which oscillate in polarity many times during the readout phase of an examination. Such techniques often suffer from phase errors caused by misalignment of the data acquisition window with respect to the readout gradient pulse used to create a readout magnetic field. Other phase errors may result from eddy currents generated during the examination sequence, particularly by the readout gradients. Such eddy currents are created by rapidly changing drive currents used to generate the readout gradients, and tend to be more pronounced with stronger gradient fields and more rapid pulsing such as that used in EPI techniques. Several unwanted image artifacts can result from these phase errors, reducing the quality of the reconstructed image. Such artifacts include image ghosting, loss of image fidelity, and so forth. While certain phase errors can be corrected by estimating phase discrepancies between odd and even echoes in a readout sequence from a reference data set, such techniques are limited in their ability to accurately correct for the phase errors. Moreover, the reference data is typically acquired prior to an actual imaging sequence, adding substantially to the time required for the examination.

Moreover, the use of reference data for phase error compensation in bipolar readout gradient pulse sequences is still somewhat useful in addressing the phase error problem, for real-time interactive MRI examinations, a single reference scan is often insufficient. Real-time imaging involves continuous changes in scan orientation, and phase errors introduced in such examination sequences depend upon the scanned plane. Consequently, new phase errors cannot typically be corrected using phase data derived from a single reference scan acquired in a different scan orientation. Although a new reference scan can be acquired at each scan location, imaging efficiency is further reduced by such additional reference scans, owing to the fact that such reference scans typically are non-phase encoded and so contain no useful image information. Moreover, since most reference data is obtained without the application of phase-encoding gradients, the data cannot account for phase errors contributed by the phase-encoding gradients used in actual imaging sequences.

There is a need, therefore, for an improved technique for correcting or compensating for potential phase errors in bipolar readout gradient acquisition sequences in MRI systems. There is a particular need for a technique which does not significantly add to the data acquisition or processing time required, and which provides effective compensation for phase errors closely associated with the individual lines of data acquired during an examination sequence.

SUMMARY OF THE INVENTION

The invention provides a technique for compensating for phase errors in bipolar readout gradient data acquisition designed to respond to these needs. The technique may be applied in any MRI pulse sequence utilizing bipolar readout gradients, but is particularly well suited to techniques such as EPI. The technique avoids the difficulties associated with reference scans performed for specific scan orientations which are difficult to apply to other scan orientations. Rather, the technique provides for compensation of each individual scan sequence. In one aspect of the technique, short reference pulses are generated for each series of readout pulses, thereby incorporating the acquisition of reference data for each set of image data. The reference pulses may comprise bipolar gradients. The reference pulses may be applied either prior to or following EPI or similar readout gradient sequenes. Data is acquired along the positive and negative lobes of the reference gradients, and phase errors are estimated from the collected data. Phase errors resulting from scan orientation are therefore inherently compensated.

DETAILED DESCRIPTION OF THE INVENTION

Figure 1:
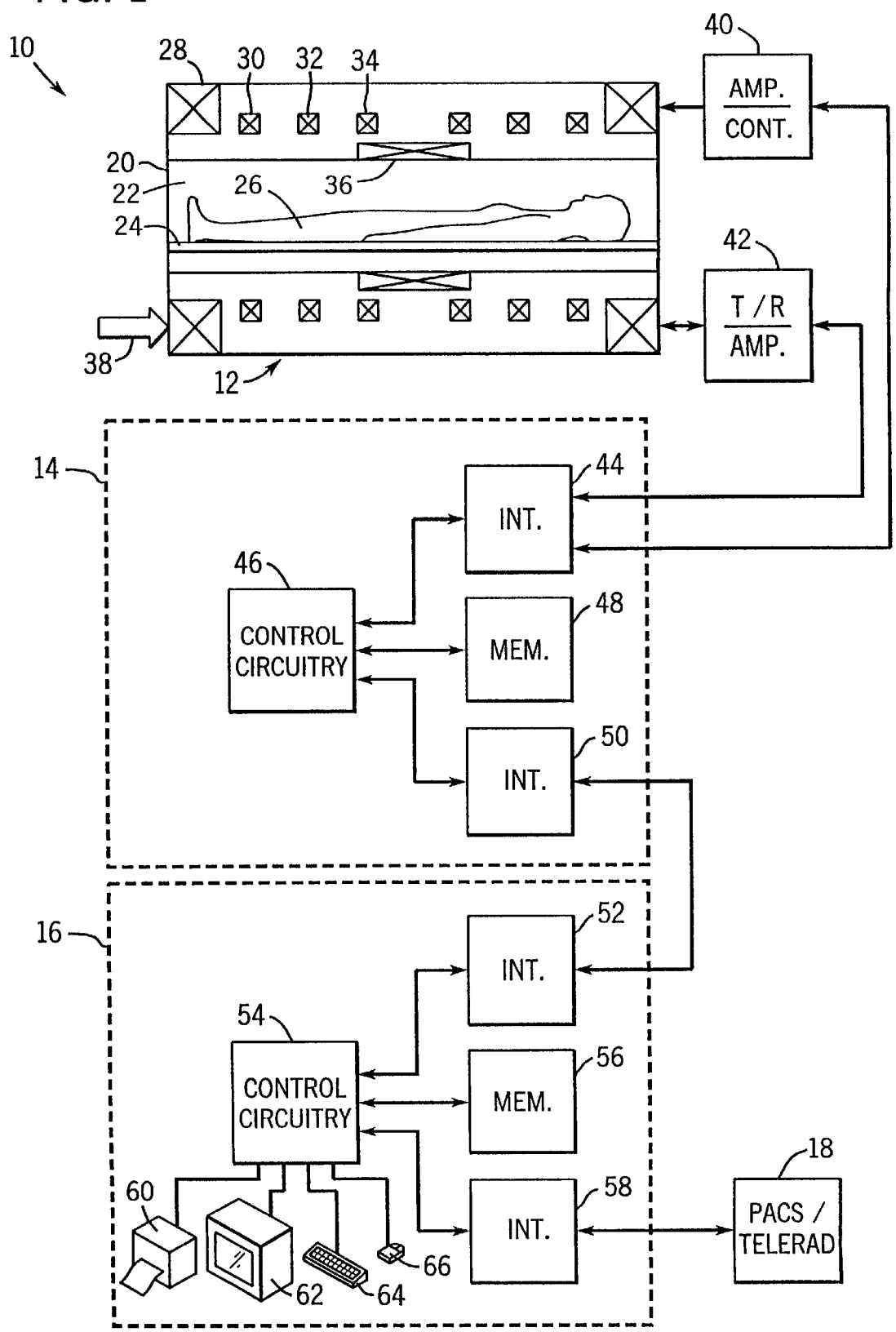
FIG. 1 is a diagrammatical representation of an MRI system adapted to provide phase error correction in accordance with aspects of the present technique.

Turning now to the drawings, and referring first to FIG. 1, a magnetic resonance imaging (MRI) system 10 is illustrated diagrammatically as including a scanner 12, scanner control circuitry 14, and system control circuitry 16. In addition, system 10 includes remote access and storage systems or devices as represented generally at reference numeral 18 which may include picture archiving and communication systems (PACS), teleradiology equipment, and so forth. While MRI system 10 may include any suitable MRI scanner or detector, in the illustrated embodiment, the system includes a full body scanner comprising a housing 20 through which a patient bore 22 is formed. A table 24 is slidable into bore 22 to permit a patient 26 to be positioned therein for imaging selected anatomy within the patient.

Scanner 12 includes a series of associated coils for producing controlled magnetic fields and for detecting emissions from gyromagnetic material within the patient in response to radio frequency pulses. In the diagrammatical view of FIG. 1, a primary magnet coil 28 is provided for generating a primary magnetic field generally aligned with the patient bore 22. A series of gradient coils 30, 32 and 34 permit controlled magnetic gradient fields to be generated during examination sequences as described more fully below. A radio frequency coil 36 is provided for generating radio frequency pulses for exciting the gyromagnetic material. While a separate receiving coil may be provided, in the illustrated embodiment, RF coil 36 also serves to receive emissions from the gyromagnetic material during examination sequences.

The various coils of scanner 12 are controlled by external circuitry to generate the desired fields and pulses, and to read emissions from the gyromagnetic material in a controlled manner. In the diagrammatical view of FIG. 1, a main power supply 38 is provided for powering the primary field coil 28. Driver circuitry 40 is provided for pulsing gradient field coils 30, 32 and 34. Such circuitry typically includes amplification and control circuitry for supplying current to the coils as defined by digitized pulse sequences output by scanner control circuitry 14. Other control circuitry 42 is provided for regulating operation of RF coil 36. Circuitry 42 will typically include a switching device for alternating between active and passive modes of operation, wherein the RF coil transmits and receives signals, respectively. Circuitry 42 also includes amplification circuitry for generating the RF pulses and for processing received emission signals.

Scanner control circuitry 14 includes an interface portion 44 which outputs signals for driving the gradient field coils and the RF coil, and for receiving data representative of the emissions produced in examination sequences. This interface component is coupled to control circuitry as represented generally at reference numeral 46. Control circuitry 46 commands execution of specific pulse sequences as defined by predetermined protocols selected via system control circuitry 16. Control circuitry 46 also serves to receive the emission signals and may perform subsequent processing on the received signals prior to transmission of the data to the system control circuitry. Scanner control circuitry 14 further includes one or more memory circuits 48 which store configuration parameters, pulse sequence descriptions, examination results, and so forth, during operation. Interface circuitry 50 is coupled to control circuitry 46 for exchanging data between scanner control circuitry 14 and system control circuitry 16. Such data will typically include selection of specific examination sequences to be performed, configuration parameters for these sequences, and acquired data which may be transmitted in raw or processed form from scanner control circuitry 14 for subsequent processing, storage, transmission and display.

System control circuitry 16 comprises an interface component 52 which receives data from scanner control circuitry 14 and transmits data and commands back to the scanner control circuitry. This interface component is coupled to control circuitry 54 which may include a CPU in a multi-purpose or application-specific computer or work station. Control circuitry 54 is coupled to memory circuitry 56 to store programming code for operation of the MRI system, as well as to store processed image data for later reconstruction, display and transmission. Additional interface circuitry 58 may be provided for exchanging image data, configuration parameters, and so forth, with external system components such as the remote access and storage devices 18. Finally, system control circuitry 16 may include various peripheral devices for facilitating operator interface and for producing hard copies of reconstructed images. In the illustrated embodiment these peripherals include a printer 60, a monitor 62, a keyboard 64 and an alternative input device such as a mouse 66. Other peripherals, including photographic film processing equipment and so forth may, of course, be included as well.

Figure 2:
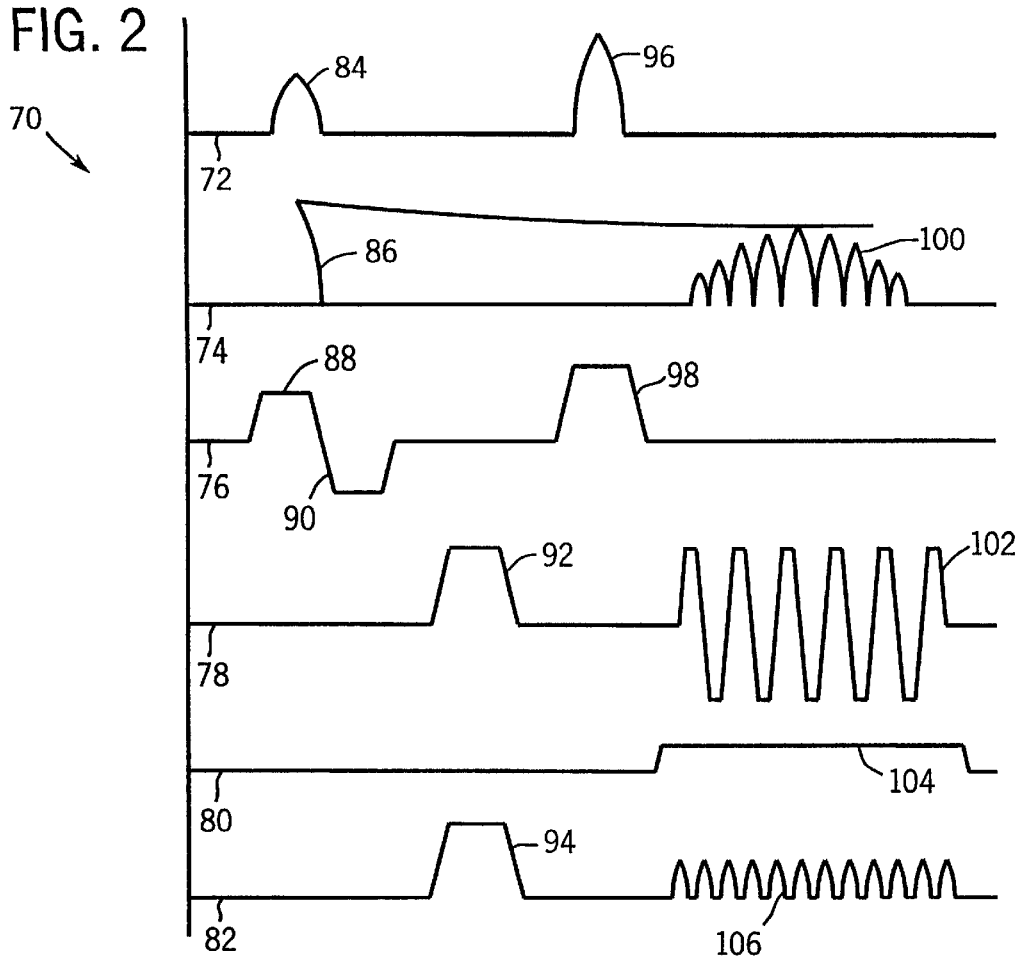
FIG. 2 is a graphical representation of pulses produced during an EPI examination, including bipolar readout gradient.

Scanner 12 and the control circuitry associated therewith produce magnetic fields and radio frequency pulses in a controlled manner to excite and encode specific gyromagnetic material within the subject patient and to sense emissions resulting from such materials. FIG. 2 illustrates an exemplary pulse sequence which may be carried out on system 10. The pulse sequence of FIG. 2 is an echo planar imaging (EPI) pulse sequence in which a series of emissions are rapidly detected through a specially adapted readout sequence. The EPI pulse sequence 70 may thus be represented as pulses on a series of controlled logical axes, including an RF axis 72, a signal axis 74, a slice select gradient axis 76, a readout gradient axis 78, and phase encoding gradient axis 80 and 82. In the pulse sequence of FIG. 2, two types of phase encoding are illustrated, including a constant encoding gradient and a "blipped" encoding sequence. In practice, one or the other phase encoding technique would be employed.

The EPI sequence of FIG. 2 proceeds as follows. A 90° RF pulse 84 is first produced to generate a transverse magnetic moment in the gyromagnetic material of interest, resulting in a signal 86 which decays over time. As RF pulse 84 is produced, so is a positive-going gradient lobe 88 on the slice select gradient axis 76, followed by a negative-going pulse 90 on the same axis. Subsequent to the pulses on the slice select gradient axis, a gradient pulse 92 is produced on the readout gradient axis. Where a blipped phase encoding scheme is employed as illustrated on axis 82, an additional gradient pulse 94 may be employed on that axis. Following the foregoing pulses, a 180° RF pulse 96 is produced by the RF coil. Simultaneously, a slice select gradient pulse 98 is produced to select the slice to be imaged. Those skilled in the art will note that the foregoing pulse sequence defines a spin-echo EPI sequence. The present technique may be employed with other types of pulse sequences, including gradient-echo EPI sequences, in which the 180 RF pulse 96 and the slice select pulse 98 are eliminated, and the gradient pulse 92 is inverted in polarity.

Following the foregoing preparatory pulses, oscillating readout gradient pulses 102 are produced on the readout axis 78. Each of these readout gradient pulses oscillates in polarity to read a series of echoes 100 on the signal axis. In an exemplary single-shot EPI sequence, data representative of 128 such echoes may be collected during the readout phase of the examination. During the period in which the oscillating readout gradients 102 are produced, gradients are also produced on the phase encoding axis as indicated at reference numerals 104 and 106. In the case of the constant phase encoding technique, this gradient is generally constant in amplitude. For the blipped phase encoding approach, a series of pulses are produced on axis 82 generally centered at zero-crossings of the oscillating gradients produced on the readout axis.

Figure 3:
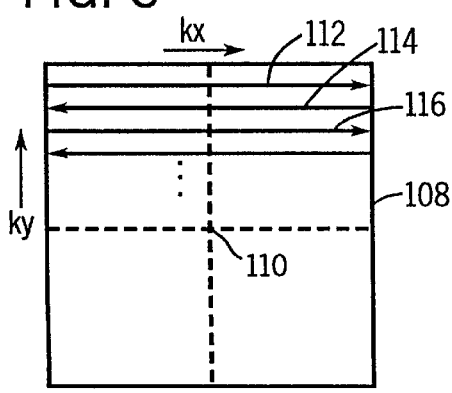
FIG. 3 is a graphical representation of lines of data obtained in k-space from the pulse sequence of FIG. 2.

As will be appreciated by those skilled in the art, the EPI pulse sequence of FIG. 2 permits a number of frames of "k-space" data to be collected in the readout phase of operation. Such data, collected in the time domain, may be further filtered and processed, such as through two-dimensional fast Fourier transformation to obtain frequency domain data used to reconstruct an image comprising individual picture elements or pixels representative of signal emission intensities from individual volume elements or voxels of the selected slice. The oscillating readout gradients 102 of the sequence cause individual lines of k-space data to be collected in oscillating or alternating directions in k-space as illustrated in FIG. 3. As shown in FIG. 3, the k-space frame 108 has a center 110 at the intersection of a ky direction and a kx direction. Data collected in the pulse sequence of FIG. 2 will comprise lines in k-space extending alternately from left to right as indicated at reference numerals 112 and 116, interleaved with lines of data collected in an opposite direction as indicated at reference numeral 114. As the lines of k-space data are sequentially collected, the k-space frame is filled and the data may be further processed to obtain information relating to the composition of the various voxels to be imaged.

In conventional EPI pulse sequences, it has been found that phase errors may result from such factors as misalignment of the data acquisition window with respect to the readout gradients. Such misalignment would thus be represented in FIG. 2 by misalignment of pulse sequences 102 with sequence 104 or 106. Moreover, phase errors can result from misalignment between the start of data acquisition and each readout lobe. Moreover, eddy currents produced by the rapidly-changing magnetic fields during the pulse sequence can lead to further errors in the pulse sequence, particularly phase errors. As a result of such phase errors, image ghosting, loss of image fidelity, and other image degradation and artifact events may occur which cannot generally be corrected through subsequent data processing. While such phase errors may be partially corrected by estimating phase discrepancies between non-phase encoded odd and even echoes (see echoes 100 in FIG. 2), such techniques are generally not performed in real time and may not adequately compensate for actual phase errors.

Figure 4:
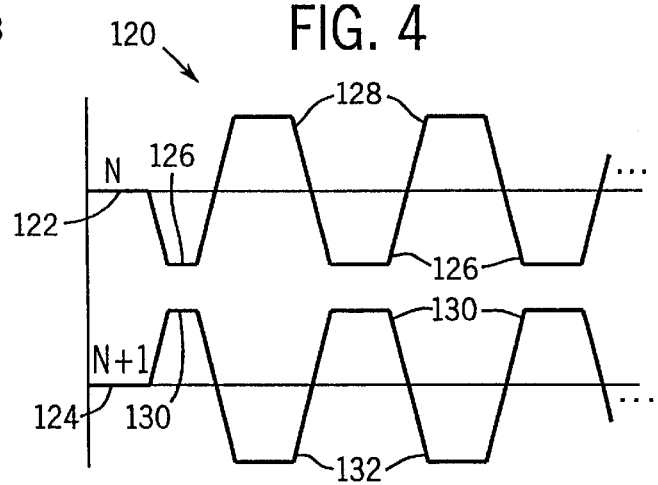
FIG. 4 is a graphical representation of normal and inverted bipolar readout gradient pulses used for phase error.
Figure 5:
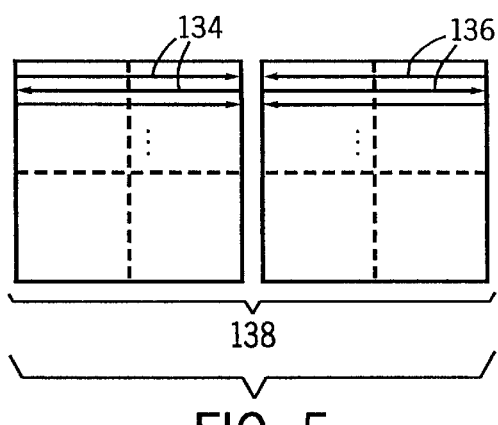
FIG. 5 is a graphical representation of lines of k-space acquired through the use of the pulse sequences of FIG. 4.
Figure 6:
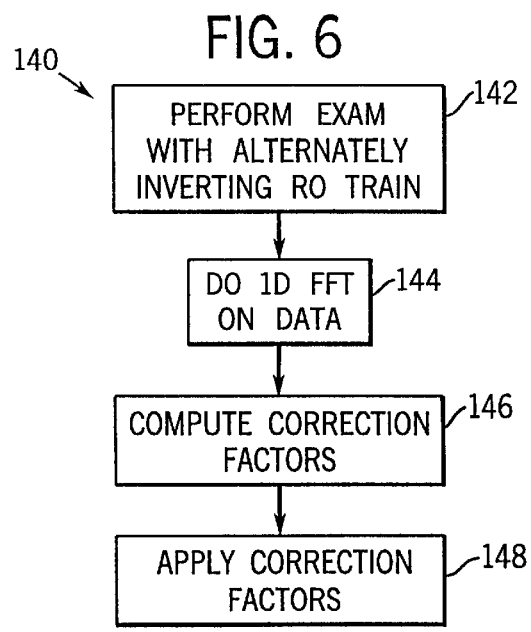
FIG. 6 is a block diagram illustrating steps in exemplary control logic for carrying out the phase correcting readout sequence illustrated in FIG. 4 and FIG. 5.

The present technique provides a mechanism for compensating for phase errors in bipolar readout gradient pulse sequences, such as EPI examination sequences of the type illustrated graphically in FIG. 2. FIGS. 4, 5 and 6 illustrate a first approach to correction of such phase errors. As shown in FIG. 4, in a first embodiment, phase encoded reference data is continuously acquired to correct for phase errors in real time. In this approach, the entire bipolar gradient readout train, as indicated at reference numeral 102 in FIG. 2, is inverted for each new image or frame of k-space data (i.e. for each subsequent frame) acquired. The resulting alternating bipolar readout sequences, indicated by reference numeral 120 in FIG. 4, thus comprise a first set of readout pulses 122 produced for each odd k-space frame data set and a second, inverted pulse sequence 124 for each even k-space frame data set. The readout pulse sequences are inverted such that negative-going pulses 126 and positive-going pulses 128 are inverted at similar times in the pulse sequence as compared to corresponding positive-going pulses 130 and negative-going pulses 132 of the inverted sequence, respectively.

The k-space data sets produced through the alternating inverted readout pulse sequences of FIG. 4 acquire the sequential lines of data in opposing directions or orientations in each successive k-space frame, as illustrated diagrammatically in FIG. 5. Thus, for k-space frames N produced by application of the pulse sequence 122 of FIG. 4, lines of data are acquired in alternating directions as indicated by lines 134 in FIG. 5. For similarly timed acquisitions in each even or N+1 k-space frame, lines of data are acquired in an oppositely oriented direction, as indicated by reference numeral 136 in FIG. 5. The resulting series of k-space frames produces a family 138 which is used in this embodiment for generating correction factors for one another.

This phase error correction routine logic is illustrated through the exemplary steps summarized in FIG. 6. In this logic, represented generally by reference numeral 140, an EPI examination is performed with the alternately inverted oscillating readout pulse train of FIG. 4, as indicated at step 142 in FIG. 6. Again, the alternately inverted readout pulse train results in the acquisition of a series of k-space data sets in which the acquisition orientation alternates. The acquired image data is then processed by application of a one dimensional fast Fourier transform as indicated at step 144. This step effectively places the data in the "x projection space." Subsequently, correction factors are computed for each individual line of k-space data acquired in each of the frames based upon the raw (uncorrected) transformed data.

In a present embodiment, such correction factors are computed based upon the relationship:

$$C(x, k_y) = \frac{P_N(x, k_y) P_{N+1}*(x, k_y)}{|P_N(x, k_y) P_{N+1}(x, k_y)|}; \text{ for } |P_{N-1}(x, k_y)| > R;$$

where $P_{N+1}*(x, k_y)$ represents the complex conjugate of the projection along x for image N+1; $P_N(x, k_y)$ represents the projection along x for image N; and, R represents an intensity threshold (e.g. 15% of the average projection intensity).

The correction factors computed at step 146 are subsequently applied to the acquired data as follows. Correction factors for individual lines of successive k-space frames are applied to the immediately preceding k-space frames for the correction by multiplying each data point in the preceding k-space frame by the computed correction factor for the corresponding data point of the subsequent k-space frame. Thus, on a line-by-line basis, k-space frame N is used to generate correction factors for k-space frame N+1, frame N+1 for frame N+2, and so forth. In other words, the image data acquired immediately prior to the current acquisition serves as reference data for estimating phase errors.

As will be appreciated by those skilled in the art, the foregoing embodiment permits each set of image data acquired to produce both reference data as well as image data such that real time imaging efficiency is improved as compared to heretofore known techniques. Because the phase error estimates are continuously updated, moreover, time varying phase errors, such as those due to changes in the scanned plane or small displacements of the object in the field of view, are corrected as imaging progresses. Furthermore, phase errors introduced by rapidly decaying eddy currents are corrected by virtue of the inversion of the sign or orientation of such eddy currents resulting from the inverted readout gradient pulse trains. Such eddy current phase errors then tend to cancel one another.

Various alternatives and variations may be envisaged for the foregoing embodiment. For example, while the embodiment is particularly well suited to single-shot EPI examinations, it may also be applied to multiple shot EPI sequences and other bipolar readout gradient techniques. Moreover, application of the correction approach described above to odd (or even) lines of k-space data in each frame removes the sign of the phase error between even and odd k-space lines in the same image. Alternatively, the absolute phase error may be removed by multiplying every line of k-space data by the square root of the correction factors as defined above.

Figure 7:
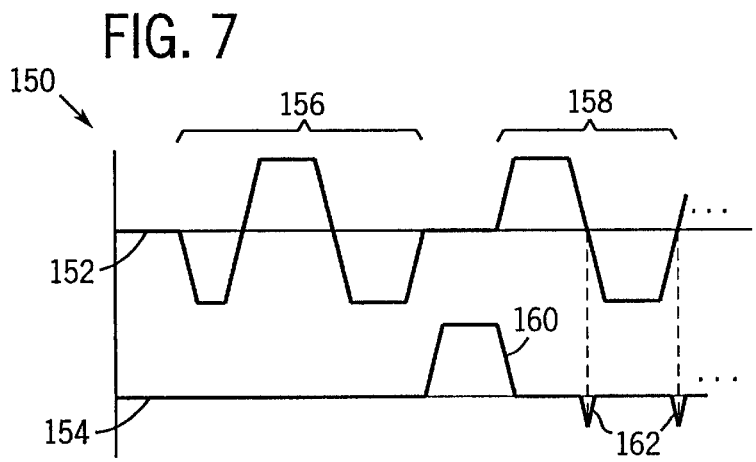
FIG. 7 is a graphical representation of a pulse sequence for read out in accordance with a phase error correction technique employing a bipolar reference prior to a readout sequence.
Figure 8:
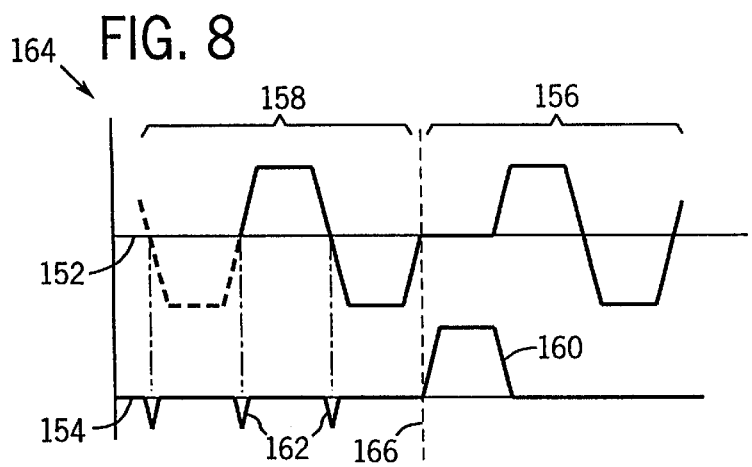
FIG. 8 is a graphical representation of a technique similar to that illustrated in FIG. 7 wherein a bipolar reference is produced after a readout sequence; and, FIG. 9 is a diagrammatical representation of a technique for phase error correction in which lines of k-space data are reformatted and resulting images are combined to obtain an average image inherently compensating for phase errors.

In another embodiment, the technique for correcting phase errors in EPI and other bipolar readout gradient sequences includes application of a series of bipolar reference gradients in real time during the EPI readout sequence. FIGS. 7 and 8 represent graphically a preferred manner in which such bipolar reference gradients may be implemented in an EPI readout sequence. As shown in FIG. 7, the modified pulse sequence, represented generally by reference numeral 150, may consist of a bipolar reference gradient 156 produced on the readout axis 152, followed by an alternating or oscillating series of readout gradients 158 which may take the form of a conventional EPI readout gradient sequence. In this embodiment, pulses produced on the phase encoding axis 154 may generally conform to standard pulse sequences including a prephaser gradient 160 followed by a series of blips 162, with the gradient 160 being positioned after the bipolar reference gradient 156.

The two-lobe bipolar reference gradient 156 is used to acquire data, both during the positive and negative lobes. Phase errors may then be estimated from the acquired reference data. As will be noted by those skilled in the art, while conventional techniques estimate such phase errors based upon reference scans performed once for an entire set of acquisition sequences, in the embodiment of FIG. 7, on the other hand, a bipolar reference gradient is produced for each acquisition sequence in the EPI readout. In the present arrangement employing this reference scan embodiment, phase errors are estimated for each data set using the correction factor equation defined above. In applying the equation, the two lobes of the reference scan comprise the N and N+1 terms. Alternatively, line fitting techniques may be employed with the reference data to identify the phase errors for the immediately subsequent acquisition sequence. The phase error correction is then applied for each data set. Thus, the technique of FIG. 7 permits correction of each line of k-space data uniquely, inherently compensating for any changes in scan orientation.

As an alternative to the embodiment of FIG. 7, individual reference scans may be produced in a similar fashion but following each oscillating EPI readout sequence. Thus, as shown in FIG. 8, a modified readout pulse sequence 164 for each line of k-space data may include a conventional EPI readout sequence 158 followed by a bipolar reference sequence 156. In this variation, the correction factors described above are calculated for the preceding readout sequence 158 based upon data acquired during the positive and negative lobes of the reference sequence 156. Again, phase errors are thus estimated for each image acquired, and phase errors resulting from changes in scan orientation are compensated.

Figure 9:
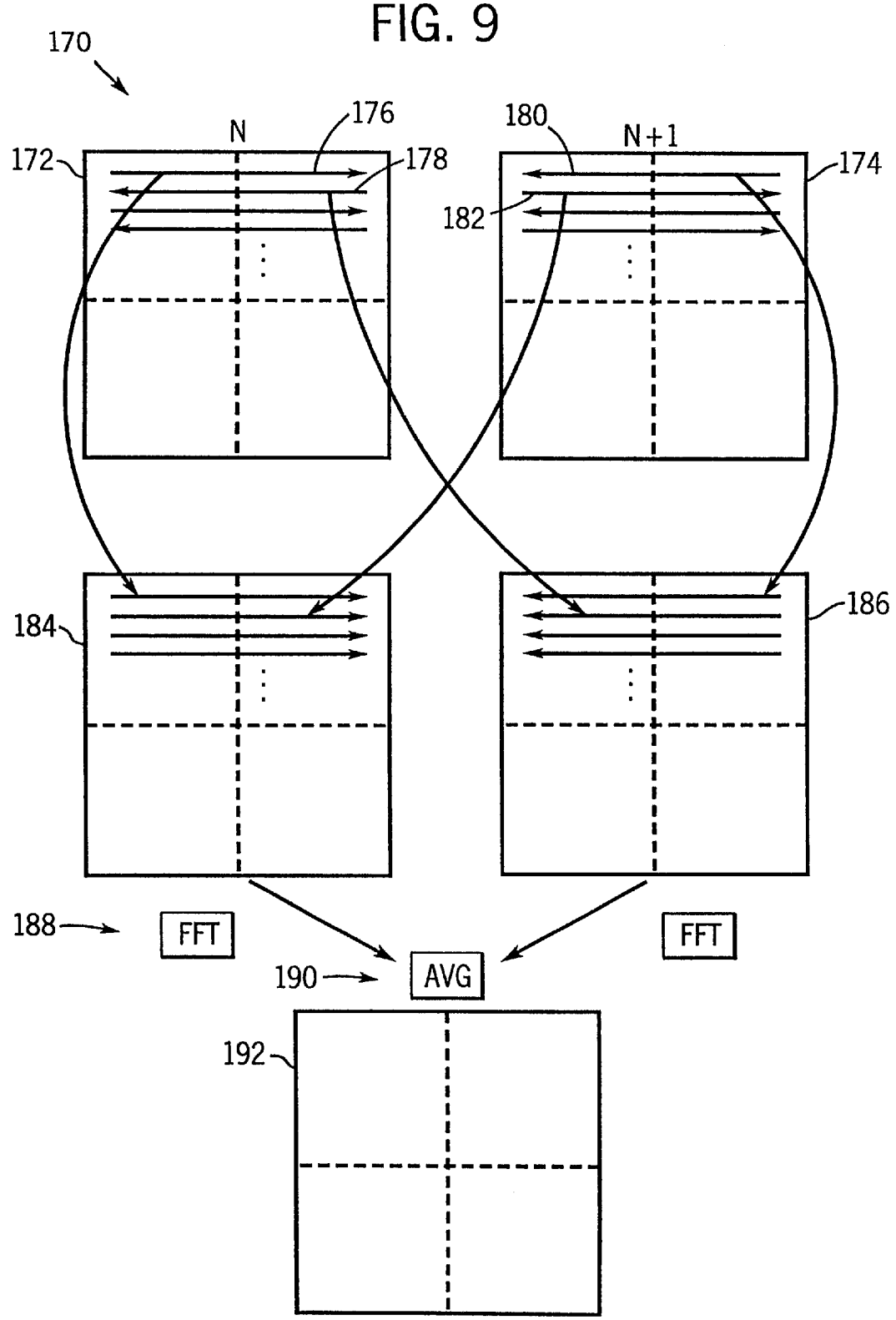

In a further embodiment for correction of phase errors in EPI and similar bipolar readout gradient techniques bipolar alternating readout pulse sequences are generated for odd and even k-frame data sets as indicated in FIG. 4 and as described above, and acquired data is then reformatted as illustrated in FIG. 9. In the embodiment summarized in FIG. 9, a series of k-space frames 170 are acquired including successive N frames 172 and N+1 frames 174. Lines of data in each of the frames will be acquired in alternating directions or orientation as indicated for lines 176 and 178 of frame 172, and lines 180 and 182 of frame 174. When all such data has been acquired, the individual lines of k-space data are reformatted by assigning lines from alternating k-space frames to revised or reformatted k-space frames as indicated for frames 184 and 186 in FIG. 9. In particular, lines acquired from left-to-right in k-space from the odd frames are assembled with similarly oriented lines of even frames to provide frames 184 and 186 in which all lines of k-space data are acquired in the same direction. Thus, the k-space data is temporally sorted such that odd and even echoes acquired between two image data sets are placed in series. When thus reformatted, the k-space lines form hybrid images in which all data has been acquired in the same direction, eliminating the need for phase correcting the hybrid image data.

Following creation of hybrid images 184 and 186, these reformatted images are processed by fast Fourier transformation as indicated at reference numeral 188 in FIG. 9. Subsequently, the transformed hybrid images are averaged as indicated at reference numeral 190 to produce a single, high signal-to-noise ratio image 192. As will be appreciated by those skilled in the art, this embodiment permits acquisition of all data, with subsequent post-processing to obtain image data which is free from phase errors.

What is claimed is:

1. A method for performing a bipolar readout gradient imaging pulse sequence in a magnetic resonance imaging system, the pulse sequence including a series of gradient pulses and radio frequency pulses producing a plurality of magnetic resonance echoes from a subject of interest, and a plurality of oscillating polarity readout pulses, the method comprising the steps of:

generating sets of oscillating polarity self-referenced readout pulses and collecting corresponding sets of image data;

for each set of self-referenced readout pulses, generating a reference pulse set and collecting sets of reference data during the reference pulse set;

estimating phase errors from the reference data; and correcting each set of image data based upon the corresponding set of reference data.

2. The method of claim 1, wherein the reference pulse sets are bipolar gradient pulses.

3. The method of claim 2, wherein each reference pulse set comprises one positive-going lobe and one negative-going lobe.

4. The method of claim 1, wherein each reference pulse set is generated prior to the corresponding readout pulse set.

5. The method of claim 1, wherein each reference pulse set is generated following the corresponding readout pulse set.

6. The method of claim 1, wherein the sets of reference data are collected without phase encoding.

7. A method for correcting phase errors in a bipolar readout gradient imaging sequences performed on a magnetic resonance imaging system, the method comprising the steps of:

performing a series of gradient field pulses and radio frequency pulses to produce magnetic resonance data;

generating sets of self-referenced readout gradient pulses, each readout gradient pulse set comprising a bipolar reference gradient and an oscillating gradient sequence;

collecting reference data during each reference gradient and image data during each oscillating gradient sequence;

estimating phase errors for each set of self-referenced gradient pulses; and correcting the image data based upon the estimated phase errors.

8. The method of claim 7, wherein in each self-referenced readout pulse set the bipolar reference gradient is generated prior to the oscillating gradient sequence.

9. The method of claim 7, wherein in each self-referenced readout pulse set the bipolar reference gradient is generated following the oscillating gradient sequence.

10. The method of claim 7, wherein each bipolar reference gradient includes a single positive-going lobe and a single negative-going lobe.

11. The method of claim 7, wherein the reference gradients are generated without phase encoding.

12. A magnetic resonance imaging system comprising:

a set of gradient coils for producing controlled gradient fields;

a radio frequency coil for applying excitation signals to a subject of interest;

a detecting coil for detecting magnetic resonance signals resulting from the excitation signals; and control circuitry configured to apply an echo planar imaging pulse sequence to the gradient and radio frequency coils, the pulse sequence including sets of self-referenced oscillating readout pulses, each set of self-referenced oscillating readout pulses comprising a reference pulse set and an image data collection pulse set, the control circuitry being further configured to collect sets of reference and image data during each set of readout pulses and to correct phase errors in each set of image data based upon the corresponding set of reference data.

13. The system of claim 12, wherein each reference pulse set comprises a bipolar reference pulse set.

14. The system of claim 12, wherein each reference pulse set comprises a single positive-going reference pulse and a single negative-going reference pulse.

15. The system of claim 12, wherein the control circuitry is configured to apply pulses to the gradient coils to orient an image slice in the subject at a desired orientation.

16. The system of claim 12, wherein the control circuit is configured to generated the sets of self-referenced readout pulses during magnetic resonance echoes resulting from a single 90 degree pulse on the radio frequency coil.

* * * * *